(12) United States Patent
Sander et al.

(10) Patent No.: US 11,381,122 B2
(45) Date of Patent: Jul. 5, 2022

(54) METHOD FOR DETECTING A PLUG-IN OPERATION

(71) Applicant: Phoenix Contact E-Mobility GmbH, Schieder-Schwalenberg (DE)

(72) Inventors: Christian Sander, Doerentrup (DE); Ulrich Wasmuth, Paderborn (DE); Marco Seelig, Leopoldshoehe (DE)

(73) Assignee: Phoenix Contact E-Mobility GmbH, Schieder-Schwalenberg (DE)

( * ) Notice: Subject to any disclaimer, the term of this patent is extended or adjusted under 35 U.S.C. 154(b) by 100 days.

(21) Appl. No.: 16/622,835

(22) PCT Filed: Jun. 8, 2018

(86) PCT No.: PCT/EP2018/065114
§ 371 (c)(1),
(2) Date: Dec. 13, 2019

(87) PCT Pub. No.: WO2018/228930
PCT Pub. Date: Dec. 20, 2018

(65) Prior Publication Data
US 2020/0198473 A1 Jun. 25, 2020

(30) Foreign Application Priority Data
Jun. 14, 2017 (DE) ............ 10 2017 113 162.0

(51) Int. Cl.
*H02J 50/80* (2016.01)
*B60L 53/62* (2019.01)
(Continued)

(52) U.S. Cl.
CPC ............ *H02J 50/80* (2016.02); *B60L 3/12* (2013.01); *B60L 53/14* (2019.02); *B60L 53/16* (2019.02);
(Continued)

(58) Field of Classification Search
CPC .................. H02J 50/80; B60L 53/62
(Continued)

(56) References Cited

U.S. PATENT DOCUMENTS 8,564,279 B2 * 10/2013 Johnson ............ G01R 1/22
324/127
8,727,802 B2 * 5/2014 Anastas ............ H01R 13/641
439/489

(Continued)

FOREIGN PATENT DOCUMENTS

DE    10 2009 025 303 A1    12/2010
DE       102010054464 A1     6/2011

(Continued)

OTHER PUBLICATIONS

Anonymous; "SAE Electric Vehicle and Plug in Hybrid Electric Vehicle Conductive Charge Coupler"; vol. J1 772 201210, Oct. 15, 2012 (Oct. 15, 2012), 94 pgs.; SAE Standard, SAE; International, US; Retrieved from the Internet: http://standards.sae.org/j_1772_2012/XP009502213.

*Primary Examiner* — Suchin Parihar
(74) *Attorney, Agent, or Firm* — Holland & Hart LLP

(57) ABSTRACT

The disclosure relates to methods for detecting a plug-in operation of a charging connector in a charging socket of an electrically drivable vehicle, wherein the charging connector has a control signal line for transmitting control signals between the electrically drivable vehicle and a charging station, including: detecting an amplitude change of a control signal on the control signal line in order to detect the plug-in operation.

19 Claims, 4 Drawing Sheets

(51) Int. Cl.
  B60L 53/66 (2019.01)
  B60L 53/14 (2019.01)
  B60L 53/30 (2019.01)
  B60L 53/16 (2019.01)
  B60L 53/31 (2019.01)
  G01R 31/69 (2020.01)
  B60L 3/12 (2006.01)
  G01R 19/10 (2006.01)
  H01R 13/66 (2006.01)
  H02J 7/00 (2006.01)

(52) U.S. Cl.
  CPC .............. B60L 53/305 (2019.02); B60L 53/31 (2019.02); B60L 53/62 (2019.02); B60L 53/66 (2019.02); G01R 19/10 (2013.01); G01R 31/69 (2020.01); H01R 13/6683 (2013.01); H02J 7/0045 (2013.01); *H01R 2201/26* (2013.01)

(58) Field of Classification Search
  USPC ........................................................ 320/109
  See application file for complete search history.

(56) References Cited

U.S. PATENT DOCUMENTS

| | | | | |
|---|---|---|---|---|
| 9,368,008 | B2* | 6/2016 | Jefferies | G08B 13/1418 |
| 10,211,576 | B2* | 2/2019 | Emrani | H01R 13/70 |
| 2007/0164547 | A1* | 7/2007 | Hammerschmidt | G05F 1/56 |
| | | | | 280/735 |
| 2011/0121780 | A1* | 5/2011 | Fukuo | B60L 53/14 |
| | | | | 320/109 |
| 2011/0216453 | A1 | 9/2011 | Haines et al. | |
| 2012/0091957 | A1 | 4/2012 | Masuda | |
| 2013/0096760 | A1* | 4/2013 | Izumi | B60L 15/20 |
| | | | | 701/22 |
| 2013/0170604 | A1* | 7/2013 | Falk | H04Q 9/00 |
| | | | | 377/15 |
| 2013/0320920 | A1* | 12/2013 | Jefferies | G08B 13/1418 |
| | | | | 320/109 |
| 2013/0325374 | A1* | 12/2013 | Hauser | G01R 31/66 |
| | | | | 702/58 |
| 2014/0184165 | A1* | 7/2014 | Takahashi | H01M 10/48 |
| | | | | 320/134 |
| 2014/0217972 | A1* | 8/2014 | Ishii | B60L 3/0069 |
| | | | | 320/109 |
| 2015/0280593 | A1* | 10/2015 | Ando | B60L 3/04 |
| | | | | 363/17 |
| 2016/0294116 | A1* | 10/2016 | Kloppenburg | A47B 88/407 |
| 2017/0229821 | A1* | 8/2017 | Emrani | H01R 13/70 |
| 2018/0269619 | A1* | 9/2018 | Beimdieck | H01R 13/42 |
| 2020/0052446 | A1* | 2/2020 | Schiefelbein | H01R 13/11 |

FOREIGN PATENT DOCUMENTS

| | | |
|---|---|---|
| DE | 102010045329 A1 | 3/2012 |
| DE | 102012005681 A1 | 10/2012 |
| DE | 102011056501 A1 | 6/2013 |
| DE | 10 2014 215 123 A1 | 2/2016 |
| EP | 2767430 A1 | 8/2014 |

* cited by examiner

METHOD FOR DETECTING A PLUG-IN OPERATION

CROSS-REFERENCES

The present application is a national stage entry of international application PCT/EP2018/065114, filed 8 Jun. 2018, entitled "METHOD FOR DETECTING A PLUG-IN OPERATION", and claims the benefit of German Patent Application No. 10 2017 113 162.0, filed 14 Jun. 2018, entitled "VERFAHREN ZUM ERFASSEN EINES STECK VORGANGS". Each of these applications is incorporated by reference herein for all purposes.

BACKGROUND

The present disclosure relates to a method for detecting a plug operation of a charging plug in a charging socket of an electrically driven vehicle.

Plug connections are usually used to realize a separation and/or a connection of electrical and/or optical signal lines. These signal lines can be used for example for the transfer of electrical energy and/or data. A plug operation refers to plugging in the charging plug into the charging socket and/or plugging out the charging plug from the charging socket. For detecting the plug operation, a sensor, for example a mechanical button or proximity switch can be used, which detects the plugging in and/or the plugging out of the charging plug. Alternatively, the detection of the plug operation can be done electrically by monitoring an electrical connection, which is realized by the plug operation. For example, an electrical signal can be tapped at an internal resistance of the charging plug and/or the charging socket. However, this tap can disadvantageously cause an increased component complexity in the charging plug and/or the charging socket. Likewise, a mechanical detection of the plug operation may have the disadvantage that a further mechanical component may be necessary.

SUMMARY

It is the object of the present disclosure to provide a more efficient method of detecting a plug operation.

This object is solved by the features of the subject matters of the independent claims. Advantageous examples are subject of the dependent claims, the description and the accompanying figures.

The present disclosure is based on the finding that the above object can be achieved by detecting a change in a signal level on a control line in a plug operation, wherein the control line is electrically disconnected or connected by the plug operation. The connector may be in particular a detachable connection of the charging plug with the charging socket.

According to a first aspect, the disclosure relates to a method for detecting a plug operation of a charging plug in a charging socket of an electrically driven vehicle, wherein the charging plug comprises a control signal line for transmitting control signals between the electrically driven vehicle and a charging station, with detecting an amplitude change of a control signal on the control signal line to detect the plug operation.

The amplitude change of the control signal may in particular be a change in current and/or voltage amplitude. If electrical energy is transmitted via the plug connection between the electrically drivable vehicle and the charging station, in particular an energy storage of the electrically drivable vehicle is charged, a control signal with a voltage amplitude of, for example, 3V can be applied to the control signal line. If no electrical energy is transmitted between the charging station and the electrically driven vehicle, a control signal with a voltage amplitude of, for example, 12V may be applied to the control signal line. The resulting amplitude difference of 9V can be detected to detect a charge or a plug operation, respectively.

The change in amplitude may be a change in the maximum amplitude of a signal, in particular an alternating voltage signal or the change of an averaged amplitude, in particular a quadratic averaged amplitude (RMS).

The charging plug and the charging socket can be connected to one another positively and/or force-fitting after the plug operation. Furthermore, the charging plug can be electronically and/or mechanically locked in the charging socket. The electrically drivable vehicle may in particular be a motor vehicle or rail vehicle, which may function to drive the power or rail vehicle via an electric motor. In addition, the electrically drivable vehicle may have an energy storage in order to store electrical energy and, without a connection to the charging station, to supply the electric motor with electrical energy.

Via the control signal line, the energy transfer between the electrically driven vehicle and the charging station can be controlled. In particular, a charging current and/or a charging voltage of an electrical energy transmitted via the plug connection can be adapted via the control signal line. The electrical energy can be transmitted via a separate line, which can be adapted in particular for high electrical power. The electrical voltage may be an AC voltage or a DC voltage with a voltage amplitude of 500 V, for example. A current flowing with the electrical voltage can have a current of, for example, 50 A to 200 A, wherein the current can be distributed over a plurality of electrical lines, in particular three lines. For example, a total current of 189 A may be distributed in equal parts of 63 A on three electrical lines.

In particular, the control signal may be a pulse-width-modulated signal (PWM), wherein a duration of a pulse may be correlated with the electrical current strength and/or electrical voltage provided by the charging station. In particular, specific pulse widths can be assigned to specific pulse widths.

The charging station may be a publicly accessible station that may be used to charge a plurality of different electrically powered vehicles. The charging station can be connected to a power grid and/or to an energy storage, wherein the charging station can supply the electrically drivable vehicle with electrical energy from the power grid and/or the energy storage.

An electronic circuit in the electrically drivable vehicle, in the charging station and/or in the plug can be adapted to detect the amplitude change of the control signal and to trigger a subsequent action. For example, with the detected amplitude change of the control signal, an electrical connection for the energy flow from the charging station to the electrically driven vehicle can be interrupted and/or connected.

Detecting the plug operation can be used to lock the connector to prevent release of the connector. In particular, the control signal line can be connected and/or disconnected in the plug operation before the load-carrying line, so that an interruption of the electrical power supply is possible in an interruption of the control signal line, before the contacts of the load-carrying line are exposed.

The plug operation may further include locking and/or unlocking of the plug in the socket. The locking can be done mechanically and/or electronically, wherein the locking of the electrically driven vehicle, the plug and/or the charging station can be controllable.

In particular, the charging plug can be a standardized IEC 62196 type 2 or type 3 plug, which can be used to connect the charging station to an electrically driven vehicle.

In one example, the charging plug includes a proximity pilot line (PP) and a control pilot line (CP), the control signal line being the CP line of the charging plug, and the control signal being the CP control signal.

Via the CP line, the electrically drivable vehicle can communicate with the charging station and signal, for example, a charge release. Furthermore, the charging current can be limited via the PP line, which flows via a charging line from the charging station to the electrically driven vehicle, for example to avoid overloading the charging cable, the charging electronics of the electrically driven vehicle, the energy storage of the electrically driven vehicle and/or the charging station.

With the PP line and/or the CP line, the advantage is achieved that a digital control electronics for detecting the plug operation in the electrically driven vehicle, the plug and/or the charging station can be dispensed. Furthermore, an immobilizer as well as residual current-, overload- and/or component protection can be realized via the PP line.

In one example, detecting the plug operation comprises changing a voltage amplitude of the control signal.

As a result, the advantage is achieved that a tapping of an electrical signal for detecting the plug operation, for example on an internal resistance of the charging socket and/or the charging plug may not be necessary. The change in the voltage amplitude can be detected, for example, with a voltage measuring circuit, which can be integrated in the charging socket, the charging plug and/or the charging station, wherein the measuring circuit may further comprise an optical indicator for indicating the change in the voltage amplitude.

In one example, the plug operation is detected in the event of an amplitude change by at least one predetermined amplitude deviation, in particular 5V or 8V or 9V.

With a sufficiently large amplitude stroke, the advantage is achieved that a voltage fluctuation on the control signal line, which does not correspond to a predetermined amplitude stroke, a plug operation is not detected. The greater the amplitude deviation, the less susceptible to fluctuations of the control signal, the detection of the plug operation can be realized.

In one example, the method counts the number of detected plug operations to detect a number of plug cycles.

As a result, the advantage is achieved that a plug connection, which is adapted for a certain number of plug connections, can be maintained and/or replaced upon reaching the specific number of plug operations, for example, to maintain the continuous functionality of the plug connection.

In one example, the detection of the amplitude change is performed in the charging plug or in the charging socket, in which the charging plug is plugged, or in the electrically driven vehicle.

As a result, the advantage is achieved that the plug operation can be detected efficiently, since no additional components for detecting the plug operation may be necessary. In particular, the detection of the plug operation can be realized by already existing electrical lines and/or electronic circuits. Furthermore, the change in amplitude can be displayed directly and comfortably by means of a display on the charging plug, on the charging socket, on the electrically driven vehicle and/or on the charging station.

In one example, the detection of the amplitude change comprises a signal measurement on the control signal line, in particular a voltage measurement.

In one example, the amplitude change is detected capacitively or resistance-based.

With a capacitive detection of the change in amplitude, the advantage is achieved that the amplitude change can be detected without contact and/or without influencing the control signal.

In one example, the method further comprises a communication interface, in particular a near-field communication interface, which is adapted to emit a reference signal which indicates the detected plug operation or a number of detected plug operations.

In one example, in the method, the charging operation is stopped after reaching a predetermined number of plug operations.

As a result, the advantage is achieved that even with a successfully manufactured and detected plug connection no charge current flows through the plug connection. Thus, in particular the security of the charging operation with respect to incomplete plug connections can be advantageously increased, in particular due to wear of the charging plug and/or the charging socket.

Reaching and/or approaching the predetermined number of plug operations can be signaled to a user by means of an optical, acoustic and/or haptic indicator in the electrically driven vehicle, the charging station and/or the charging plug. Thereby the advantage is achieved that the user is informed about the specific number of plug operations.

The charging operation can also take place upon reaching a predetermined number of plug operations. The electrically driven vehicle, the charging plug and/or the charging station can issue a warning about reaching the predetermined number of plug operations.

According to a second aspect, the disclosure relates to a device for detecting a plug operation of a charging plug in a charging socket of an electrically driven vehicle, the charging plug having a control signal line for transmitting control signals between the electrically driven vehicle and a charging station, with an electrical circuit for detecting a change in amplitude of a control signal on the control signal line to detect the plug operation.

The device may in particular be integrated into an electronic charging circuit which is arranged in the electrically drivable vehicle, the charging plug and/or the charging station. Detecting the plug operation in the electrically drivable vehicle has the advantage that information about the accumulated mechanical load which acts on the charging socket of the electrically drivable vehicle can be generated. Based on this information, the time of maintenance of the charging socket can be determined, since the charging socket can be adapted, for example, for a limited number of plug operations.

A device for detecting a plug operation, which is arranged in the charging station, achieves the advantage of a reduced component effort in the charging plug and/or the charging socket. The charging plug can in particular be releasably connected to the charging station so that the charging plug can be exchangeable separately from the charging station. The charging plug can be connected, for example by means of a cable to the charging station.

In one example, the electrical circuit is configured to measure a change in an amplitude of the control signal, in particular by a predetermined amplitude stroke, in order to detect the plug operation.

As a result, the advantage is achieved that different amplitude strokes can be assigned to different functions. In particular, a plug procedure is not generally detected in the case of an amplitude deviation. By realizing the detection of a plug operation via an amplitude deviation of the control signal, the detection of the plug operation can be independent of an absolute amplitude value of the control signal.

In one example, the electrical circuit is adapted to detect the change in amplitude capacitively or resistance-based.

In one example, the device further has a communication interface, in particular a near-field communication interface, for emitting a notification signal that indicates the detected plug operation or a number of detected plug operations.

The communication interface can be adapted in particular to communicate with a communication device wirelessly. The connection between the communication interface and the communication device can be realized, for example, via a WLAN, NFC, Bluetooth, RFID, mobile communication, 5G connection and/or via further standardized communication links. As a result, the advantage is achieved that regardless of further components of the electrically driven vehicle, the charging plug and/or the charging station, information about the detection of the plug operation can be provided to a communication device.

In one example, the electrical circuit is further configured to detect a number of detected plug operations. The number of detected plug operations can be recorded or stored permanently, in particular even in a de-energized state of the device. For this purpose, a memory may be provided in the charging plug. In the de-energized state, the electrical power supply of the electrical circuit and/or the device for detecting a plug operation may be interrupted.

According to a third aspect, the disclosure relates to a charging component for a vehicle, in particular a charging plug or a charging socket, with the device according to the second aspect.

By integrating the device in the charging component, the advantage is achieved that the detection of the plug operation, by detecting the amplitude change on the control signal line can be realized independently of the electrically driven vehicle and/or independently of the charging station. Furthermore, the charging component can be an electronic unit which is independent of the electrically driven vehicle and/or the charging station and which detects the plug operation and/or a number of recorded plug operations by means of a display, an optical and/or acoustic indicator and/or or signals by vibration to a user of the charging device.

These optical, acoustic and/or haptic indicators may additionally or alternatively be arranged in the electrically drivable vehicle and/or in the charging station.

BRIEF DESCRIPTION OF THE DRAWINGS

Further examples will be explained with reference to the accompanying figures. They show.

DETAILED DESCRIPTION

Figure 1:
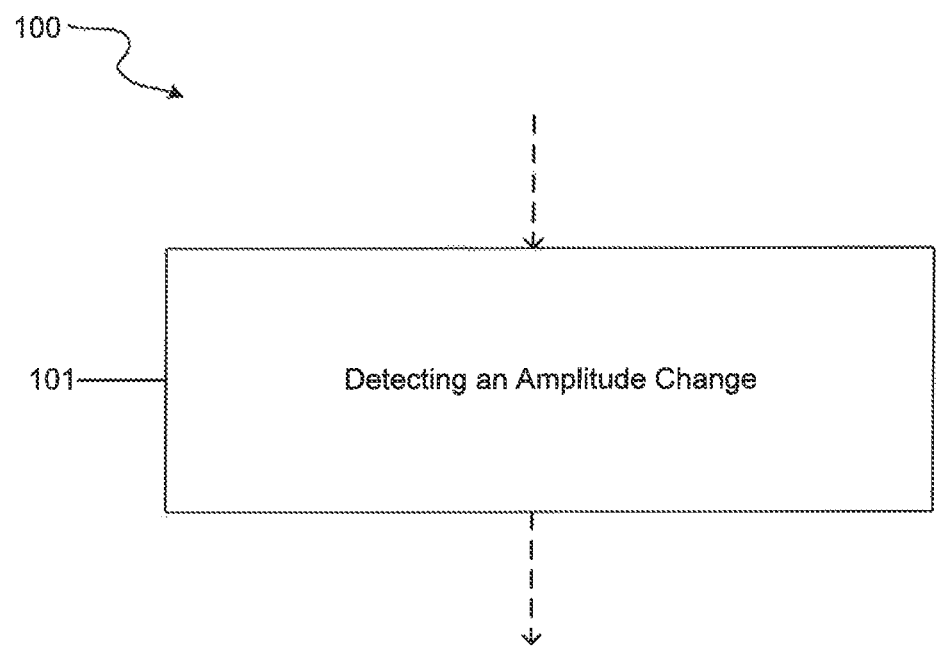
FIG. 1 shows a method according to an example.

FIG. 1 shows a method 100 for detecting a plug operation of a charging plug into a charging socket of an electrically driven vehicle, the charging plug having a control signal line for transmitting control signals between the electrically drivable vehicle and a charging station, with detection 101 of an amplitude change of a control signal on the control signal line to detect the plug operation.

The detection of the plug operation comprises a change of a voltage amplitude of the control signal. The change in the voltage amplitude can be realized when closing the plug connection and/or when opening of the plug connection by the plug operation.

The plug operation is detected at an amplitude change by at least a predetermined amplitude stroke, in particular 5V or 8V or 9V. In the method 100, further, the number of detected plug operations may be counted to detect a number of plug cycles. The detection 101 of the amplitude change is carried out in the charging plug or in the charging socket into which the charging plug can be plugged or in the electrically driven vehicle. Furthermore, the detection 101 of the amplitude change may include a signal measurement on the control signal line, in particular a voltage measurement. The amplitude change can be detected capacitively or resistance-based. In addition, a charging operation can be prevented after reaching a predetermined number of plug operations.

Figure 2:
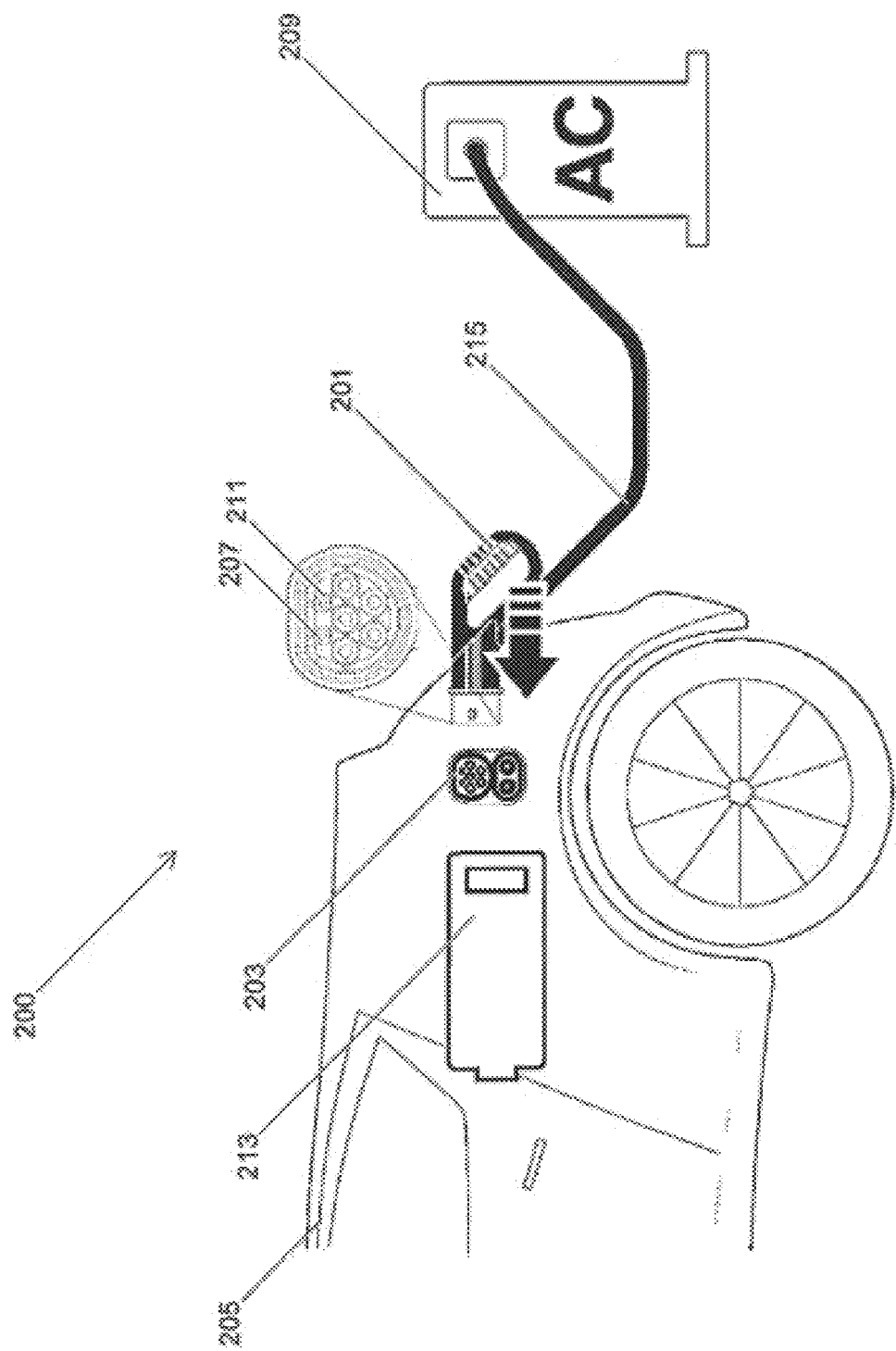
FIG. 2 shows a plug operation according to an example.

FIG. 2 shows a schematic representation of a plug operation 200 of a charging plug 201 in a charging socket 203 of an electrically driven vehicle 205, the charging plug 201 having a control signal line 207 for transmitting control signals between the electrically driven vehicle 205 and a charging station 209.

The charging plug 201 has a proximity pilot line (PP) 211 and a control pilot line (CP), the control signal line 207 being the CP line of the charging plug 201, and the control signal being the CP control signal.

The electrically driven vehicle 205 is a motor vehicle with an electric motor and an electrical energy storage 213, which may be formed in particular by a composite of lithium-ion batteries. The charging plug 201 is connected via a charging cable 215, which has at least the PP line 211, the control signal line 207 and at least one further electrical line. The further electrical line is adapted to conduct electrical energy from the charging station 209 to the electrically driven vehicle 205, in particular to the electrical energy storage 213. The charging station 209 is adapted to supply the electrically driven vehicle 205 with electrical energy after a successful plug operation 200. The charging station 209 provides the electrical energy in the form of an AC voltage and/or a DC voltage. The charging cable 215 may be detachably connected, for example via a plug connection or firmly connected to the charging station 209.

The charging socket 203 may be arranged externally accessible on the electrically driven vehicle 205. Thus, the charging operation can be carried out in particular even with a locked, electrically driven vehicle 205 and/or without access to an interior of the electrically driven vehicle 205. The charging socket 203 is arranged in the rear part of the electrically driven vehicle 205. In particular, the charging socket 203 may be arranged in a C-pillar or a fender of the electrically driven vehicle 205.

The plug connection between the charging socket 203 and the charging plug 201 can be mechanically and/or electronically locked so that the plug connection between the electrically driven vehicle 205 and the charging station 209 can be protected against unauthorized access. As a result, the charging operation can also take place without the presence of a user and/or monitoring of the charging station 209.

Figure 3:
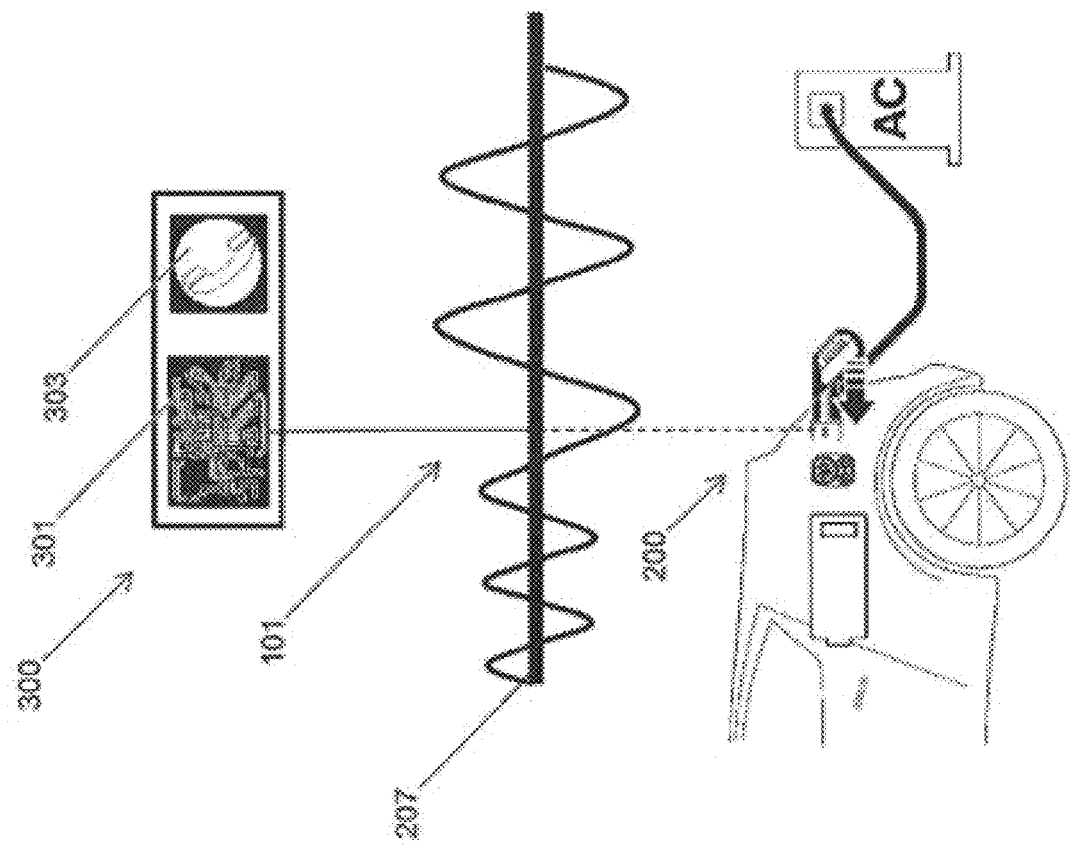
FIG. 3 shows a device according to an example.

FIG. 3 shows a schematic representation of a device 300 for detecting a plug operation 200 of a charging plug 201 in a charging socket 203 of an electrically driven vehicle 205, the charging plug 201 having a control signal line 207 for transmitting control signals between the electrically driven vehicle 205 and a charging station 209, with an electrical circuit 301 for detecting 101 an amplitude change of a control signal on the control signal line 207 to detect the plug operation 200.

The electrical circuit 301 is configured to measure a change in an amplitude of the control signal, in particular by a predetermined amplitude stroke, in order to detect the plug operation 200. The amplitude change is detected capacitively or resistance-based by the electrical circuit 301. The electrical circuit 301 is further configured to detect a number of detected plug operations 200.

In addition, the device 300 for detecting the plug operation 200 has a communication interface 303, in particular a near-field communication interface, which is adapted to emit a reference signal which indicates the detected plug operation 200 or a number of detected plug operations 200.

Figure 4:
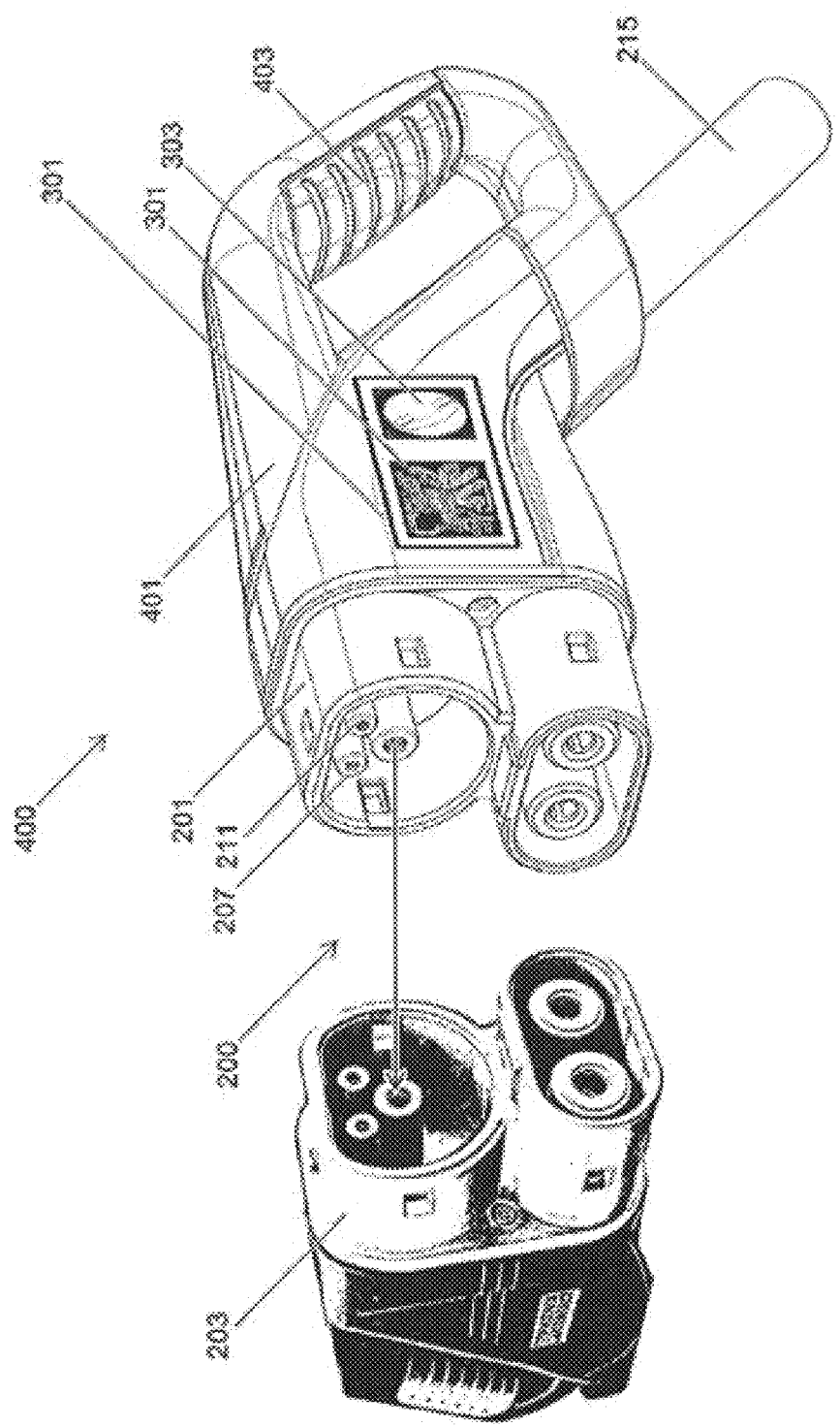
FIG. 4 shows a charging component according to an example.

FIG. 4 shows a schematic representation of a charging component 400 for an electrically drivable vehicle with the device 300 for detecting a plug operation 200 of a charging plug 201 in a charging socket 203 of an electrically driven vehicle 205, wherein the charging plug 201 has a control signal line 207 for transmitting control signals between the electrically powered vehicle 205 and a charging station 209. The device 300 has an electrical circuit 301 for detecting 101 an amplitude change of a control signal on the control signal line 207 to detect the plug operation 200.

The device 300 for detecting a plug operation 200 of a charging plug 201 in a charging socket 203 of an electrically driven vehicle 205 further has a communication interface 303, in particular a near field communication interface, which is adapted to send an indication signal, indicating the detected plug operation 200 or a number of detected plug operations 200. The electrical circuit 301 is further configured to detect a number of detected plug operations 200.

The charging component 400 is a charging connector 201 which is connected to a charging cable 215. The device 300 for detecting a plug operation 200 is integrated in the charging component 400, in particular in a housing 401 of the charging component 400. The housing 401 has a handle for holding the charging component 400 by a user. The charging cable 215 is in particular angled relative to the orientation of the charging plug 201 and/or arranged parallel to the handle, so that upon a gripping of the charging component on the handle by a user of the charging plug 201 is aligned with the charging socket 203. In particular, it is aligned such that the plug contacts of the charging plug 201 are aligned exactly matching the socket contacts of the charging socket 203. The arrangement of the plug contacts of the charging plug 201 is asymmetrical, so that the plug operation 200 is possible only in a single orientation of the charging plug 201.

The charging plug 201 has 5 plug contacts, which are divided into two groups, which are each surrounded by a web. A group of 3 plug contacts includes the control signal line 207, which is a CP line and the PP line 211.

LIST OF REFERENCE NUMBERS 100 procedure
101 detecting
200 plug operation
201 charging plug
203 charging socket
205 electrically driven vehicle
207 control signal line
209 charging station
211 proximity pilot line
213 energy storage
215 charging cable
300 device
301 electrical circuit
303 communication interface
400 charge component
401 housing
403 handle

What is claimed is:

1. A method for detecting a plug operation of a charging plug in a charging socket of an electrically drivable vehicle, comprising:
    detecting the plug operation by detecting an amplitude change of a control signal on a control signal line of the charging plug, wherein the control signal line is configured to transmit control signals between the electrically drivable vehicle and a charging station;
    detecting a number of plug cycles by counting a number of detected plug operations; and
    signaling an approaching of a predetermined number of plug operations to a user via an optical indicator in the electrically drivable vehicle, an acoustic indicator in the electrically drivable vehicle, a haptic indicator in the electrically drivable vehicle, the charging station, the charging plug, or any combination thereof.

2. The method according to claim 1, wherein the charging plug comprises a proximity pilot (PP) line and a control pilot (CP) line, the control signal line connecting the CP line of the charging plug, and wherein the control signal is the CP control signal.

3. The method according to claim 1, wherein detecting the plug operation comprises a change of a voltage amplitude of the control signal.

4. The method according to claim 1, wherein the detecting the amplitude change of the control signal of the charging plug to detect the plug operation comprises detecting an amplitude change satisfying at least one threshold.

5. The method according to claim 1, wherein detecting the amplitude change is performed in one or more of: the charging plug, or in the charging socket, or in the electrically drivable vehicle.

6. The method according to claim 1, wherein the detection of the amplitude change comprises a signal measurement on the control signal line, in particular a voltage measurement.

7. The method according to claim 1, wherein the amplitude change is detected capacitively or based on resistance.

8. The method according to claim 1, further comprising emitting a reference signal via a communication interface, wherein the reference signal indicates the detected plug operation or the number of detected plug operations.

9. The method according to claim 1, further comprising preventing a charging operation after reaching a threshold number of plug operations.

10. A device for detecting a plug operation of a charging plug in a charging socket of an electrically drivable vehicle, comprising:
    an electrical circuit configured to:
        detect the plug operation by detecting an amplitude change of a control signal on a control signal line of the charging plug, wherein the control signal line of the charging plug is configured to carry control signals between the electrically drivable vehicle and a charging station;

detect a number of plug cycles by counting a number of detected plug operations; and signal an approaching of a predetermined number of plug operations to a user via an optical indicator in the electrically drivable vehicle, an acoustic indicator in the electrically drivable vehicle, a haptic indicator in the electrically drivable vehicle, the charging station, the charging plug, or any combination thereof.

11. The device according to claim 10, wherein the electrical circuit is further configured to measure a change in an amplitude of the control signal by at least a threshold amount.

12. The device according to claim 10, wherein the electrical circuit is further configured to detect the amplitude change capacitively or based on resistance.

13. The device according to claim 10, further comprising a communication interface, configured to emit a notification signal which indicates the detected plug operation or the number of detected plug operations.

14. The device according to claim 10, wherein the electrical circuit is further configured to detect the number of detected plug operations.

15. A charging component for an electrically drivable vehicle, comprising:
 a charging interface comprising one or more of: a charging plug or a charging socket; and
 an electrical circuit configured to:
  detect a plug operation by detecting an amplitude change of a control signal on a control signal line of the charging plug, wherein the control signal line of the charging plug is configured to carry control signals between the electrically drivable vehicle and a charging station;
  detect a number of plug cycles by counting a number of detected plug operations; and
  signal an approaching of a predetermined number of plug operations to a user via an optical indicator in the electrically drivable vehicle, an acoustic indicator in the electrically drivable vehicle, a haptic indicator in the electrically drivable vehicle, the charging station, the charging plug, or any combination thereof.

16. The charging component of claim 15, wherein the electrical circuit is further configured to measure a change in an amplitude of the control signal by at least a threshold amount.

17. The charging component of claim 15, wherein the electrical circuit is further configured to detect the amplitude change capacitively or based on resistance.

18. The method of claim 4, wherein the at least one threshold comprises one or more of: a 5V threshold, an 8V threshold, or a 9V threshold.

19. The method of claim 8, wherein the communication interface is a near field communication interface.

* * * * *